United States Patent [19]

Nakamura et al.

[11] Patent Number: 4,670,765

[45] Date of Patent: Jun. 2, 1987

[54] SEMICONDUCTOR PHOTODETECTOR ELEMENT

[75] Inventors: Tutomu Nakamura, Nara; Masaru Shiraishi, Kashiwa; Masaru Nawaki, Nara, all of Japan

[73] Assignee: Sharp Kabushiki Kaisha, Osaka, Japan

[21] Appl. No.: 716,372

[22] Filed: Mar. 26, 1985

[30] Foreign Application Priority Data

Apr. 2, 1984 [JP] Japan ................................ 59-66168
Apr. 3, 1984 [JP] Japan ................................ 59-67148

[51] Int. Cl.4 ......................................... H01L 27/14
[52] U.S. Cl. ...................................... 357/30; 357/2; 357/40
[58] Field of Search ...................... 357/30, 24, 34, 52, 357/2, 61, 59, 45, 40

[56] References Cited

U.S. PATENT DOCUMENTS

4,589,003 5/1986 Yamada et al. ........................ 357/30

Primary Examiner—James W. Davie
Assistant Examiner—Georgia Y. Epps
Attorney, Agent, or Firm—Flehr, Hohbach, Test, Albritton & Herbert

[57] ABSTRACT

A semiconductor photodetector element has a three-dimensional multi-layer structure including a photoconductive layer for photoelectric conversion, a layer for binary conversion and amplification and a layer including a redundancy circuit so that the need for external reset and clock inputs can be obviated and correct image information can be expected even if there are defective cells among the photodetection conversion cells.

17 Claims, 12 Drawing Figures

SEMICONDUCTOR PHOTODETECTOR ELEMENT

BACKGROUND OF THE INVENTION

This invention relates to a semiconductor photodetector element suited as an image sensor in various types of image processing. In particular, it relates to a semiconductor photodetector element for use in a bar code reader and for pattern collation of plane images.

Semiconductor photodetector elements were conventionally so designed that the rows of image elements constituting a screen were scanned in one fixed direction. As a result, if a row of photodetector cells on such an element contained a defective cell, it was not possible by the element by itself to detect the error in image information caused by the output from this defective cell. For this reason, it was considered necessary in order to obtain reliable image information to output information for each screen successively to a processing system for optimization. Another disadvantage of unidirectional scanning was that the image data could be taken in only successively so that difficulties arose in the case of a moving image or a pseudo-stationary image because the conventional semiconductor photodetector element required external clock synchronization for scanning and one could obtain information only on such image changes restricted by this clock synchronization.

In the signal amplification circuit of a conventional semiconductor photodetector element, furthermore, since the signal reading line was shared by different image element rows, a reset input in synchronism with the external clock was necessary for each scan.

Summary of the Invention

It is therefore an object of this invention to provide a semiconductor photodetector element adapted to output correct data with a fixed level of reliability without an external optimization processing system even when defective cells are contained.

It is another object of this invention to provide a semiconductor photodetector element which can not only be used in the conventional manner but also obviate the need for an external reset and an external clock input because its signal reading line is automatically reset whenever it becomes dark, or when there is no input of light.

The above and other objects of the present invention are attained by a semiconductor photodetector element comprising an active layer for photoelectric conversion by a photoconductive layer and an active element which is composed of a pull-up transistor, an inverter and a return transistor for binary conversion and amplification and disposed under the active layer and on a silicon substrate, SOI (silicon on insulator) or silicon on sapphire. Another semiconductor photodetector element according to a second embodiment of the present invention is a three-dimensional SOI structure comprising an active layer for photoelectric conversion by a photoconductive layer, a second active layer including a signal processing circuit for binary conversion and amplification and a redundancy circuit which allows correct image information to be outputted by ignoring defective cells which may be among the plurality of cells for light detection and binary conversion.

BRIEF DESCRIPTION OF THE DRAWINGS

FIG. 4 shows the voltage change at a node in FIG. 3 when power is initially switched on.

DETAILED DESCRIPTION OF THE INVENTION

Figure 1:
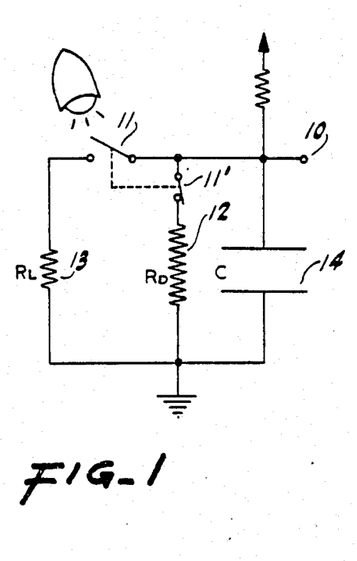
FIG. 1 is an equivalent circuit for the photodetector section of a semiconductor photodetector element of the present invention using a block-layer type photoconductive layer.

There is shown in FIG. 1 an equivalent circuit for the photodetector section of a semiconductor photodetector element of the present invention using a block-layer type photoconductive layer. Nos. 11 and 11' indicate photosensitive switches which turn on and off, respectively, when there is light and off and on, respectively, when there is no light. No. 12 is a dark resistor ($R_D$) and No. 13 is a light resistor ($R_L$). If amorphous silicon, SeAsTe or $ZnSe-Zn_{1-x}Cd_xTe$ is used as the photoconductive layer, the specific resistance of the dark resistor 12 ($r_D$) is about $10^8$–$10^{12}$ ohm-cm while the specific resistance of the light resistor 13 ($r_L$) is less than about 1/100 of $r_D$. Thus, $R_D = r_D t/S$ and $R_L = R_D r_L/r_D$ where t is the thickness of the photoconductive layer and S is the surface area where light is incident. No. 14 shows the equivalent capacitance C of a transparent electrode covering the photoconductive layer made, for example, of ITO (indium tin oxide) and a metallic electrode disposed opposite thereto. FIG. 1 shows an embodiment wherein the ITO is grounded while the opposite electrode is positively biased.

Figure 2:
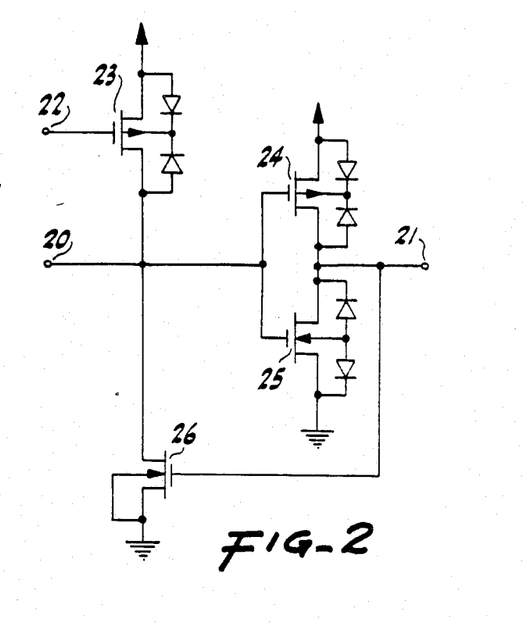
FIG. 2 is a binary conversion processing circuit formed on an SOI structure.

In the circuit diagram of FIG. 2 for a binary conversion processing circuit of the semiconductor photodetector element of the present invention, an analog signal after photoelectric conversion is inputted to an input terminal 20 and a digital binary signal is outputted from an output terminal 21. No. 22 shows a reset input terminal. According to this embodiment, a p-channel pull-up transistor 23, and sense inverter transistors 24 and 25 are formed on SOI and an n-channel return transistor 26 is on a third active layer such as a silicon substrate. All these transistors inclusive of the return transistor 26, however, may be formed on SOI, SOS (silicon on sapphire) or a silicon substrate. A semiconductor photodetector element of the present invention results if the node 10 in the equivalent circuit of FIG. 1 is connected to the input terminal 20 of the binary conversion circuit of FIG. 2.

Figure 3:
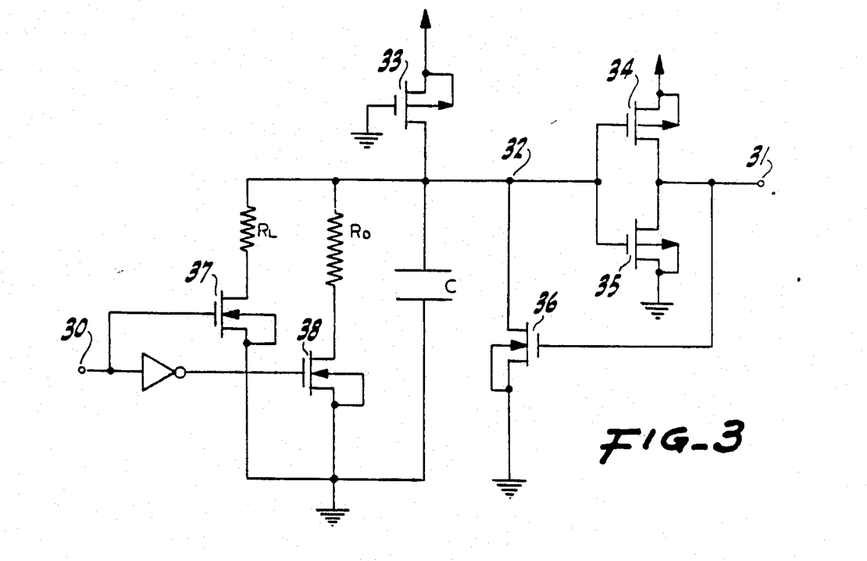
FIG. 3 is an equivalent circuit of a photodetector element for binary conversion image processing.

FIG. 3 is an equivalent circuit of a photosensor for binary conversion processing where the switches 11 and 11' of FIG. 1 are represented by NMOS transistors 37 and 38, respectively. Voltages corresponding to logic "High" and "Low" are applied to the input terminal 30, depending on whether light is incident or there is no light. No. 33 shows a pull-up transistor, Nos. 34 and 35 are sense inverter transistors and No. 36 is a return transistor. In this embodiment, the gate input of the pull-up transistor 33 is grounded and the output from the terminal 31 becomes automatically reset when the light input is cutoff.

Figure 4:
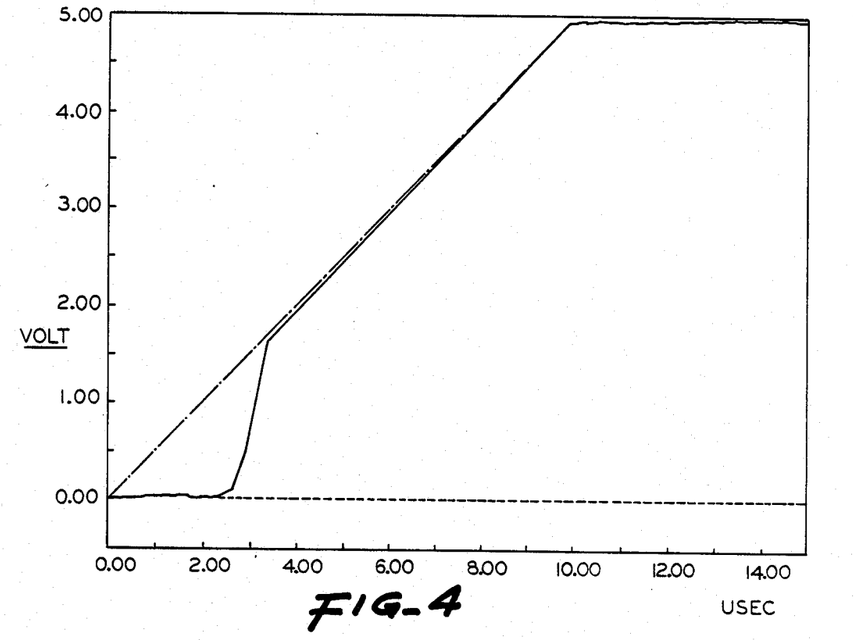
Figure 5:
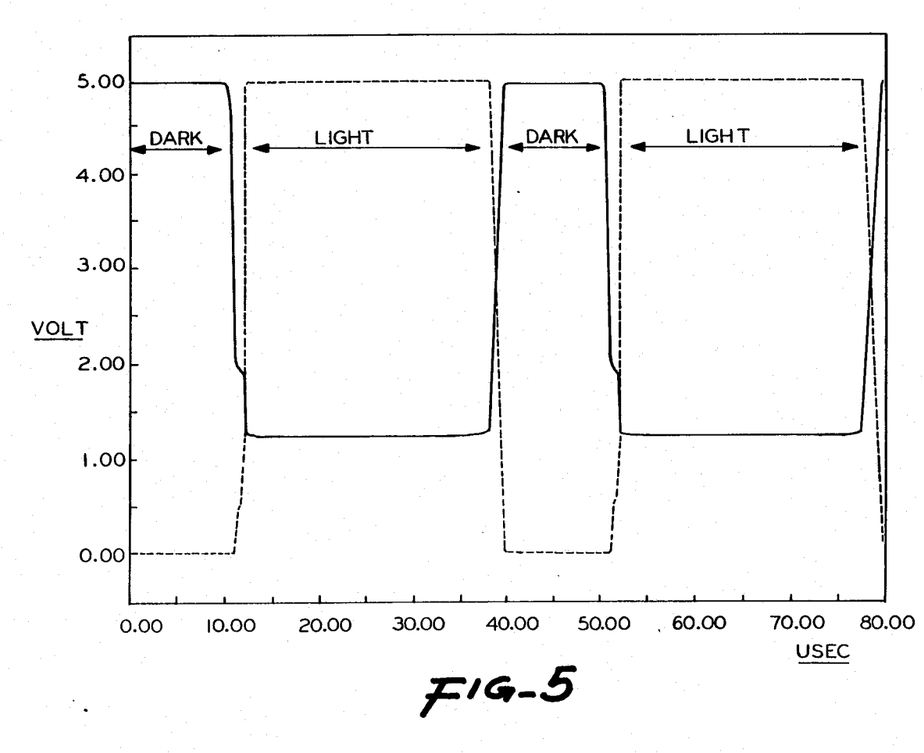
FIG. 5 shows the waveform of the binary conversion output signal.

The solid line in FIG. 4 shows the temporal change of the voltage at the node 32 of FIG. 3 when power is first switched on so that the source voltage increases linearly as shown by the dot-and-dash line. FIG. 5 shows the voltage variations for the binary conversion output signal of the photodetector element (sensor) and the node 32 of FIG. 3. It clearly shows that the output signal is maintained at the "High" level after light is made incident until the light intensity drops to a certain level so that there results a static two-value output corresponding to light intensity.

Figure 6:
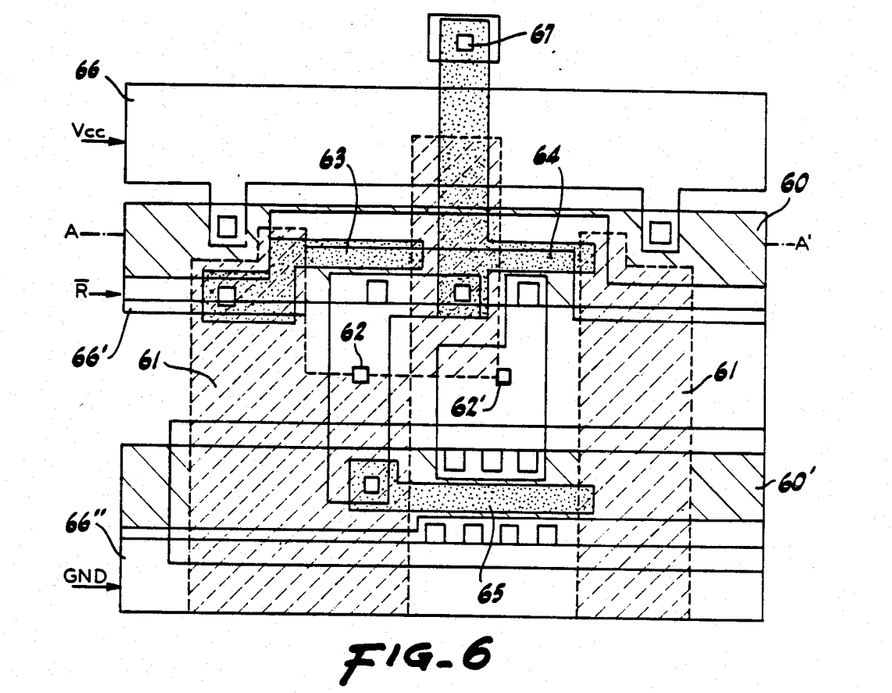
FIG. 6 is an example of mask pattern for a semiconductor photodetector element embodying the present invention.

FIG. 6 is an example of mask pattern of a semiconductor photodetector element (sensor cell) with a SOI structure using amorphous silicon. The ITO transparent electrode adapted to receive light and the electrode opposite thereto as well as amorphous silicon are patterned on the top surface of and with the same size as the cell. In FIG. 6, Nos. 60 and 60' are island-like single crystal areas obtained by melting polycrystalline silicon. The area 60 is where a p-channel transistor is formed while the area 60' is where an n-channel transistor is formed. Nos. 63, 64 and 65 are transistors, respectively corresponding to the transistors 33, 34 and 35 of FIG. 3. Nos. 62 and 62' are through holes to the active layer below SOI. The through hole 62 is provided to connect the drain of the transistor 36 of FIG. 3 (an n-channel transistor formed on the silicon substrate) and the gate of the p-channel transistor 64 while the through hole 62' is for returning the sense inverter output formed by the transistors 64 and 65 to the transistor 36 of FIG. 3. Area 61 is a separation area for electrically insulate the active element while areas 66, 66' and 66" are wiring areas, forming respectively a power line, a reset signal line and a grounding line. No. 67 is a through hole provided for connection to the metallic electrode in the light receiving section at the top layer.

Figure 7:
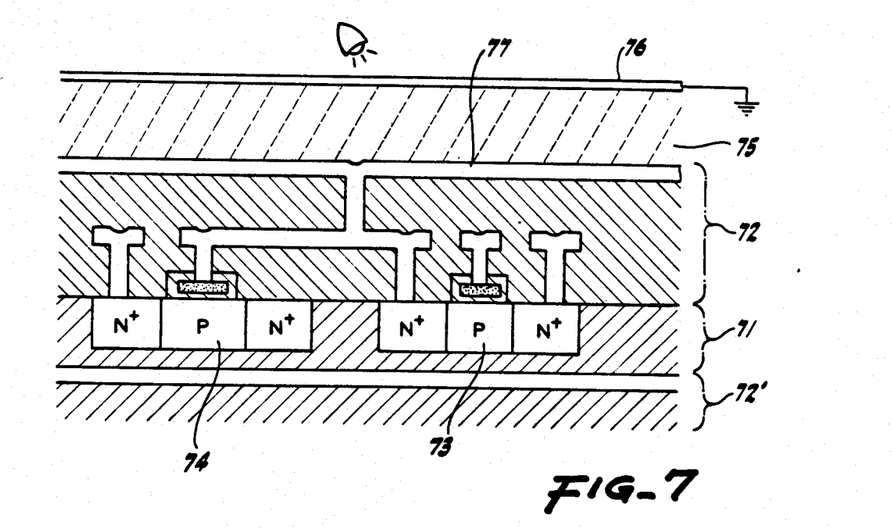
FIG. 7 is a sectional view of the pattern of FIG. 6 taken along the line A—A' therein.

FIG. 7 is a cross-sectional view of the example shown in FIG. 6, taken along the line A—A'. In FIG. 7, No. 71 is a separation layer by means of which transistors 73 and 74 corresponding to the transistors 63 and 64 formed on the p-channel area 60 of FIG. 6 are insulatively formed. Nos. 72 and 72' are insulative layers respectively for the photoconductive layer and for the lower active layer. Nos. 75, 76 and 77 respectively show photoconductive amorphous silicon, ITO electrode and the metallic electrode connected to the through hole 67 of FIG. 6.

In summary, the semiconductor photodetector element described above has a circuit structure with the power-on reset function. It also has as a unit sensor cell a binary conversion circuit section including a photodetector section by a photoconductive layer and signal amplification so that light input signal can be taken simultaneously into all cells in parallel. When the input of light to the element is cutoff, the output signals of all cells can be automatically reset.

Figures 8, 9:
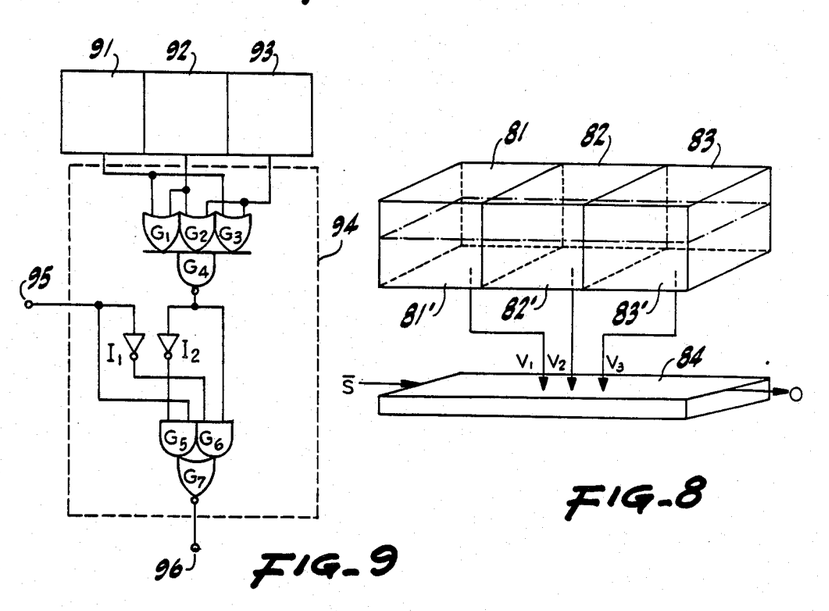
FIG. 8 shows the structure of an element according to a second embodiment of the present invention with functions of detector cells and logic circuit corresponding to a single image element.
FIG. 9 is a block diagram showing the structure of a selection logic unit.

A second embodiment of the present invention is shown in FIG. 8 where three unit detector cells are logically linked together to obtain information regarding a single image element. In FIG. 8, Nos. 81, 82 and 83 are light receiving sections using photoconductive layers of the same size while Nos. 81', 82' and 83' are binary conversion processing and amplification sections, the light receiving sections 81, 82 and 83 being placed above the sections 81', 82' and 83'. The sections 81', 82' and 83' are formed as a SOI structure above the selection logic section 84 formed on the silicon substrate. If majority logic is adopted as the selection logic for the silicon 84, output O corresponding to the majority logic value can be obtained by $\bar{S}$="Low" corresponding to the outputs $V_1$, $V_2$ and $V_3$ of the three detector cells 81, 82 and 83.

FIG. 9 is a block diagram showing an example of majority logic circuit wherein Nos. 91, 92 and 93 are unit detector cells corresponding to the light receiving sections 81, 82 and 83 of FIG. 8. The outputs $V_1$, $V_2$ and $V_3$ of these cells 91, 92 and 93 are inputted to a logical circuit section 94. The logical circuit section 94 includes OR gates, $G_1$, $G_2$ and $G_3$, a NAND gate $G_4$, inverters $I_1$ and $I_2$, AND gates $G_5$ and $G_6$, and a NOR gate $G_7$, and is adapted to select the majority logic or the minority logic, depending on whether the input level of the input terminal 25 is "High" or "Low" so that the terminal 96 can output reliable data on individual image elements. Table I shows truth table of the logic circuit section 94 of FIG. 9.

TABLE I

| S | $V_1$ | $V_2$ | $V_3$ | O |
|---|---|---|---|---|
| 0 | 0 | 0 | 0 | 0 |
| 0 | 0 | 0 | 1 | 0 |
| 0 | 0 | 1 | 1 | 1 |
| 0 | 1 | 1 | 1 | 1 |
| 1 | 0 | 0 | 0 | 1 |
| 1 | 0 | 0 | 1 | 1 |
| 1 | 0 | 1 | 1 | 0 |
| 1 | 1 | 1 | 1 | 0 |

Equivalent combinations of input signals obtained by permutations of the detector cell outputs $V_1$, $V_2$ and $V_3$ are omitted in Table I.

Figure 10:
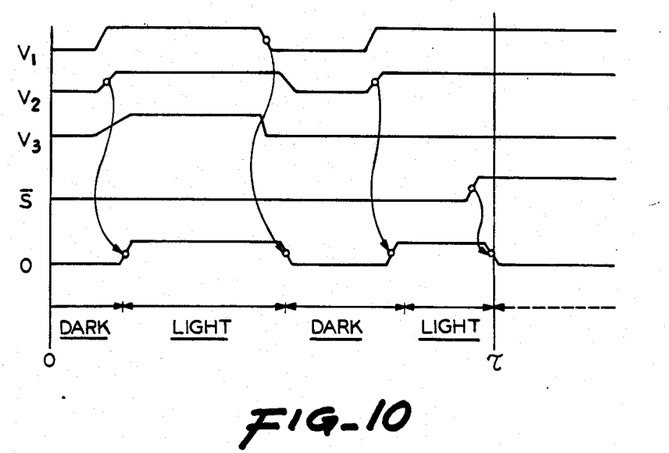
FIG. 10 is the waveforms of the input and output signals by the selection logic.

FIG. 10 shows the waveform timing of the input signals O $V_1$, $V_2$ and $V_3$ and the output signal O. As can be understood from the signal waveforms of FIG. 10, majority logic is followed if $\bar{S}$="0" because the output O is determined by the second latest edge even if there are irregular fluctuations in the rising or falling edges of the input signals $V_1$, $V_2$ and $V_3$. Consider, for example, a situation where an abnormality has occurred in the "High" level output of the detector cell output $V_3$ so that the condition of logic "1" cannot be outputted. Even in such a situation, the selection logic output O would be normal as long as the detector cell outouts $V_1$ and $V_2$ are normal.

Figure 11:
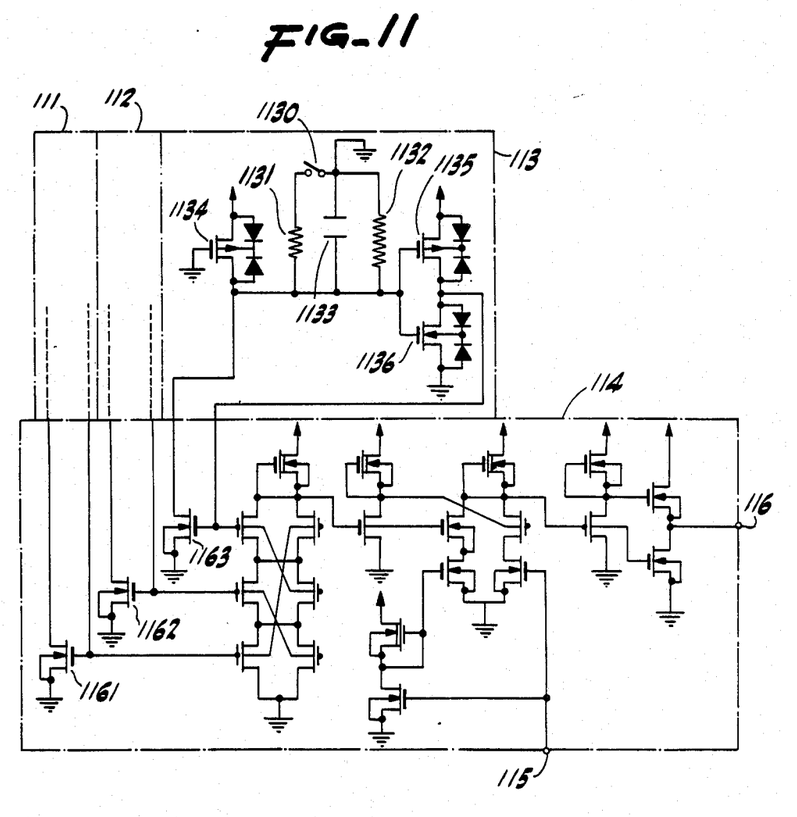
FIG. 11 shows an example of circuit for processing a single image element.

FIG. 11 shows an example of image element data processing circuit consisting of three unit detector cells. In FIG. 11, Nos. 111, 112 and 113 represent identically structured unit detector cells of which the cell 113 is used in FIG. 11 to describe the construction. The cell 113 thus comprises a first active layer and a second active layer. The first active layer is the light receiving section having amorphous silicon as a photoconductive layer between an ITO transparent electrode and an opposite electrode. The second active layer is immediately below this light receiving section and is composed of a binary conversion and amplification processing circuit including p-channel transistors 1134 and 1135 and an n-channel transistor 1136 of SOI structure. The p-channel transistor 1134 functions as a pull-up transistor while the transistors 1135 and 1136 function as sense inverter transistors. Since the gate input to the transistor 1134 is grounded, the outputs from the sense inverter transistors 1135 and 1136 are automatically reset when the input of light is cutoff and also when power is first switched on. No. 1130 is a photosensitive switch which goes on and off, depending on whether light is incident or not. Nos. 1131 and 1132 are respectively the light resistance of the photoconductive layer when light is incident and its dark resistance when light is not incident, while No. 1133 represents the capacitance between a transparent electrode and its opposite electrode. The elements 1130 through 1133 described above form the first active layer which functions as the light receiving section.

Immediately below the second active layer, there is formed a selection logic section 114 composed of n-channel transistors on a silicon substrate. Reference being made to FIG. 11, the input terminal 115 is a majority/minority logic selection terminal while the output terminal 116 is for the output of selected image element signals. Transistors 1161, 1162 and 1163 are return transistors for latching detector cell output signals.

Figure 12:
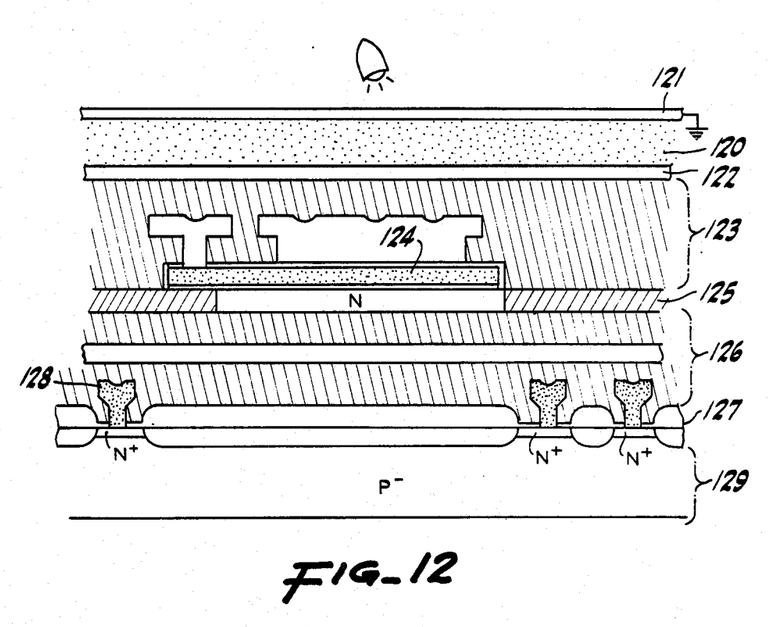
FIG. 12 is a cross-sectional view of a semiconductor photodetector element according to another embodiment of the present invention.

FIG. 12 is a cross-sectional view of the example shown in FIG. 11. In FIG. 12, No. 120 is the amorphous silicon of the photoconductive layer, No. 121 is the ITO transparent electrode, No. 122 is the metallic electrode disposed opposite the ITO transparent electrode 121, No. 123 is the insulative layer for electrically insulating the light receiving section which is the first active layer from the binary conversion processing section which is the second active layer, No. 124 is the gate polysilicon which forms an n-channel transistor, No. 125 is the separation for insulating the transistor area, No. 126 is the insulative layer for insulating the binary conversion processing section from the selection logic section which is the third active layer, No. 127 is the field oxide insulative layer, No. 128 is polysilicon for wiring, and No. 129 is a p-type silicon substrate. The selection logic section 114 is formed on this silicon substrate. The transistor 124 corresponds to the transistor 1136 in FIG. 11 and is connected longitudinally to the wiring polysilicon by the through hole on the drain side.

One of the advantages of this structural design is that single screen data can be taken in simultaneously in parallel so that it becomes physically simpler to logically link a plurality of unit detector cells for each area of application such as in accordance with whether they are for a line sensor or for an area sensor. Moreover, the base area of the element can be substantially reduced according to the design of the present invention as compared to a two-dimensionally structured element having the same functions, and flexibility can be obtained by merely changing the scale of the redundancy logic circuit section at the bottom layer as well as its electrical connections in the vertical direction to the middle layer. According to the embodiment illustrated in FIGS. 1 through 7, a logical circuit section or a memory section for the data processing incorporating an imaging processing algorithm is formed as the third layer so as to substantially reduce the number of external control elements and memory elements which were unnecessary for conventional photosensitive elements. Since a data processing section is formed below the light receiving section, faster binary conversion processing can be realized. Another advantage of three-dimensional arrangement of active elements is that mask patterns can be more flexibly designed in accordance with the transistor size. According to the embodiment illustrated in FIGS. 8 through 12, irregular fluctuations in latch timing can be absorbed because single screen data can be taken in simultaneously in parallel as explained above so that correct data can be obtained with a fixed level of reliability even if there are defective cells. In general, the probability for the presence of a defective cell is less than one-half so that the element reliability can be improved substantially merely by selecting majority logic regarding all image elements.

What is claimed is:

1. A semiconductor photodetector element in a three-dimensional layered structure comprising
    an active layer including a photoconductive layer for photoelectric conversion, a transparent electrode above said photoconductive layer and a metallic electrode below said photoconductive layer, and
    an active element for binary conversion and amplification including a pull-up transistor, inverter transistors and a return transistor, said active element being formed below said active layer, output from said active layer being applied to the input terminals of said inverter transistors, said pull-up transistor being connected between the input terminals of said inverter transistors and a power source, said return transistor being connected between the input and output terminals of said inverter transistors so as to return outputs from said inverter terminals to the input terminals of said inverter terminals.

2. A semiconductor photodetector element in a three-dimensional layered structure comprising,
    a first active layer containing a plurality of light-detecting cells each including electrodes and a photoconductive layer for photoelectric conversion,
    a second active layer formed below said first active layer containing signal processing means for binary conversion and amplification corresponding individually to said light detecting cells, and
    a third active layer formed below said second active layer containing a logical circuit to which outputs from said signal processing means are connected.

3. The photodetector element of claim 1 wherein said photoconductive layer is sandwiched between said transparent electrode and said metallic electrode.

4. The photodetector element of claim 1 wherein said active element is formed on a silicon substrate.

5. The photodetector element of claim 1 wherein said active element is formed on silicon on insulator.

6. The photodetector of claim 1 wherein said active element is formed on silicon on sapphire.

7. The photodetector of claim 1 further comprising an insulative layer sandwiched between said first active layer and said active element.

8. The photodetector element of claim 1 wherein said photoconductive layer comprises amorphous silicon and said transparent electrode is an indium tin oxide electrode.

9. The photodetector element of claim 1 wherein said pull-up transistor and said inverter transistors are formed on silicon on insulator after said return transistor is formed on a silicon substrate.

10. The photodetector element of claim 7 wherein said insulative layer includes a through hole which serves to electrically connect said metallic electrode with said active element.

11. The photodetector element of claim 1 further comprising single crystal areas obtained by melting polycrystalline silicon surrounding said active element.

12. The photodetector element of claim 1 further comprising a means for transmitting the output from said inverter transistors to said return transistor.

13. The photodetector element of claim 1 wherein said active element forms a second active layer, said semiconductor photodetector element further comprising a third active layer below said second active layer.

14. The photodetector element of claim 13 wherein said third active layer includes a data processing logical circuit.

15. The photodetector element of claim 13 wherein said third active layer includes a memory means.

16. The photodetector element of claim 2 further comprising a first insulative layer sandwiched between said first active layer and said second active layer.

17. The photodetector element of claim 2 wherein said logical circuit serves as a redundancy circuit capable of providing correct image information from said cells by ignoring defective one or ones among said cells, said logical circuit comprising OR gates each receiving outputs from two of said cells, and a NAND gate receiving outputs from said OR gates.

* * * * *